US012250838B2

(12) United States Patent
Okamoto et al.

(10) Patent No.: US 12,250,838 B2
(45) Date of Patent: Mar. 11, 2025

(54) OPTICAL DEVICE, PHOTOELECTRIC CONVERTER, AND FUEL GENERATOR

(71) Applicant: Panasonic Intellectual Property Management Co., Ltd., Osaka (JP)

(72) Inventors: Shinya Okamoto, Kyoto (JP); Atsushi Ishikawa, Osaka (JP); Yasuhisa Inada, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 644 days.

(21) Appl. No.: 17/463,637

(22) Filed: Sep. 1, 2021

(65) Prior Publication Data

US 2021/0399148 A1 Dec. 23, 2021

Related U.S. Application Data

(63) Continuation of application No. PCT/JP2020/003634, filed on Jan. 31, 2020.

(30) Foreign Application Priority Data

Mar. 29, 2019 (JP) ................................ 2019-068293

(51) Int. Cl.
*H01L 31/0232* (2014.01)
*B82Y 30/00* (2011.01)
(Continued)

(52) U.S. Cl.
CPC ........... *H10F 77/40* (2025.01); *H10F 77/143* (2025.01); *H10F 77/211* (2025.01); *B82Y 30/00* (2013.01)

(58) Field of Classification Search
CPC ......... H01L 31/0232; H01L 31/022425; H01L 31/035209; H01L 31/054; H01L 31/108;
(Continued)

(56) References Cited

U.S. PATENT DOCUMENTS

2013/0299933 A1 11/2013 Knight et al.
2014/0318596 A1* 10/2014 Juluri .............. H01L 31/022483
136/255
2020/0182789 A1* 6/2020 Suzuki ................... G01N 21/41

FOREIGN PATENT DOCUMENTS

CN 108855064 11/2018
JP 2013-106025 5/2013
(Continued)

OTHER PUBLICATIONS

Knight, M. w. et al., "Photodetection with Active Optical Antennas", Science, 2011, vol. 332, pp. 702-704 (Year: 2011).*
(Continued)

*Primary Examiner* — Yara B Green
*Assistant Examiner* — Akhee Sarker-Nag
(74) *Attorney, Agent, or Firm* — Rimon P.C.

(57) ABSTRACT

An optical device includes a nanostructure body which induces surface plasmon resonance when irradiated with light, an alloy layer which is in contact with the nanostructure body and which has a lower work function than the nanostructure body, and an n-type semiconductor which is in Schottky contact with the alloy layer. The nanostructure body is composed of one selected from the group consisting of elemental metals, alloys, metal nitrides, and conductive oxides. The alloy layer is composed of at least two metals.

18 Claims, 9 Drawing Sheets

(51) Int. Cl.
*C25B 1/04* (2021.01)
*C25B 11/04* (2021.01)
*H01L 31/0224* (2006.01)
*H01L 31/0352* (2006.01)
*H01L 31/108* (2006.01)
*H10F 77/14* (2025.01)
*H10F 77/20* (2025.01)
*H10F 77/40* (2025.01)

(58) Field of Classification Search
CPC ........ B82Y 30/00; B82Y 20/00; Y02E 10/52; Y02E 60/36; C25B 1/04; C25B 11/04
See application file for complete search history.

(56) References Cited

FOREIGN PATENT DOCUMENTS

| | | | |
|---|---|---|---|
| JP | 2013-115417 | | 6/2013 |
| JP | 2013115418 A | * | 6/2013 |
| JP | 2014-067988 | | 4/2014 |
| JP | 2015-502658 | | 1/2015 |
| JP | 2015-055000 | | 3/2015 |
| JP | 2015055000 A | * | 3/2015 |
| JP | 2016-162890 | | 9/2016 |
| JP | 2017-123316 A | | 7/2017 |
| JP | 2017-157619 A | | 9/2017 |
| JP | 2017-188536 A | | 10/2017 |
| WO | 2019/031591 | | 2/2019 |

OTHER PUBLICATIONS

JP 2013115418 A_JPP_Translation (Year: 2013).*
JP 2015055000 A English Translation (Year: 2015).*
JP_2013115418_A_J-PlatPat_JPP_Translated.pdf (Year: 2013).*
JP_2015055000_A_J-PlatPat_JPP_Translated.pdf (Year: 2015).*
International Search Report of PCT application No. PCT/JP2020/003634 dated Mar. 10, 2020.
Masanori Sakamoto et al., "Clear and transparent nanocrystals for infrared-responsive carrier transfer", Nature Communications, Jan. 24, 2019, 1-7.
Mark W. Knight et al., "Photodetection with Active Optical Antennas", Science, vol. 332, May 6, 2011, pp. 702-704.
Marco Valenti et al., "Hot Carrier Generation and Extraction of Plasmonic Alloy Nanoparticles", ACS Photonics, vol. 4, Mar. 6, 2017, pp. 1146-1152.

* cited by examiner

OPTICAL DEVICE, PHOTOELECTRIC CONVERTER, AND FUEL GENERATOR

BACKGROUND

1. Technical Field

The present disclosure relates to an optical device, a photoelectric converter, and a fuel generator.

2. Description of the Related Art

Photoelectric conversion technology using surface plasmon resonance in a Schottky structure in which a metal nanostructure body is disposed on a semiconductor is attracting attention. Electrons are temporarily excited by surface plasmon resonance are called hot electrons. Hot electrons surmount a Schottky barrier between a metal and a semiconductor, whereby charges are separated and photoelectric conversion is achieved. An element in which a metal nanostructure body is disposed on a semiconductor is also attracting attention in the field of photocatalysts.

Japanese Unexamined Patent Application Publication No. 2016-162890 (hereinafter referred to as Patent Document 1) and Japanese Unexamined Patent Application Publication No. 2014-67988 (hereinafter referred to as Patent Document 2) disclose an example of a photoelectric conversion method using an element in which metal nanoparticles having surface plasmon resonance absorption properties are disposed on an n-type semiconductor.

Mark W. Knight, Heidar Sobhani, Peter Nordlander, and Naomi J. Halas, "Photodetection with Active Optical Antennas", Science, 2011, vol. 332, pp. 702-704 (hereinafter referred to as Non-Patent Document 1) discloses a photoelectric conversion method using a Schottky element in which a metal film having a low work function and a metal film having surface plasmon resonance absorption properties are disposed on an n-type semiconductor.

Masanori Sakamoto et al., "Clear and transparent nanocrystals for infrared-responsive carrier transfer", Nature Communications, 2019, 10, 406 (hereinafter referred to as Non-Patent Document 2) discloses a photoelectric conversion device containing tin-doped indium oxide (ITO) nanoparticles exhibiting surface plasmon resonance in response to infrared light.

SUMMARY

One non-limiting and exemplary embodiment provides an optical device with enhanced photoelectric conversion efficiency.

In one general aspect, the techniques disclosed here feature an optical device including a nanostructure body which induces surface plasmon resonance when irradiated with light, an alloy layer which is in contact with the nanostructure body and which has a lower work function than the nanostructure body, and an n-type semiconductor which is in Schottky contact with the alloy layer. The nanostructure body is composed of one selected from the group consisting of elemental metals, alloys, metal nitrides, and conductive oxides. The alloy layer is composed of at least two metals.

It should be noted that general or specific embodiments of the present disclosure may be implemented as a device, an apparatus, a system, a method, or any selective combination thereof.

According to an embodiment of the present disclosure, the photoelectric conversion efficiency can be enhanced.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTION

Figure 1A:
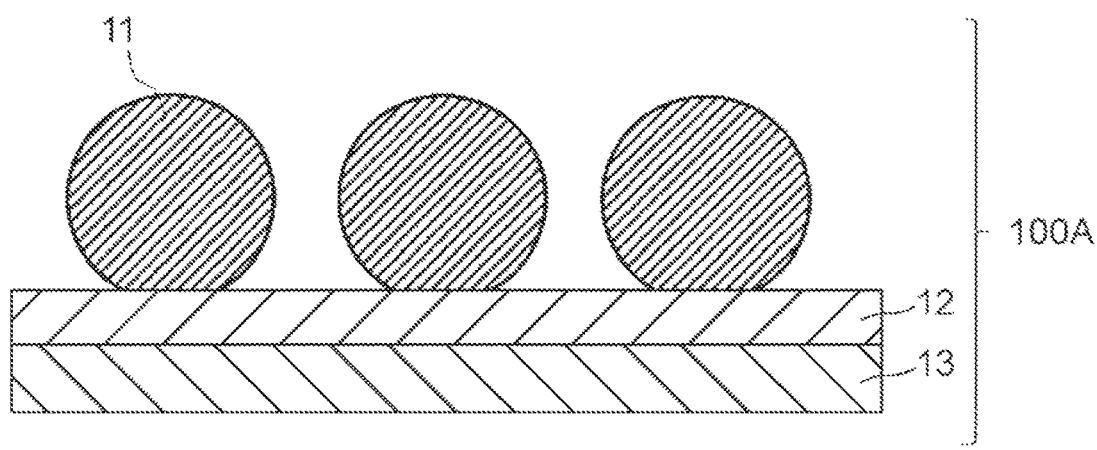
FIG. 1A is a schematic view of an example of a Schottky device according to an embodiment of the present disclosure.

Before embodiments of the present disclosure are described, knowledge found by the inventors is described.

Semiconductor photodetectors widely used at present use photoelectric conversion based on light absorption due to interband transition. Therefore, the semiconductor photodetectors cannot detect light with an energy lower than the band gap energy of a semiconductor. It is expected to achieve photoelectric conversion in a wavelength region wider than that detected by conventional semiconductor photodetectors.

It is expected to achieve a photodetector capable of detecting, for example, light in the near-infrared region (hereinafter referred to as "near-infrared light") with high sensitivity at low cost. Using near-infrared light enables high-sensitivity imaging night and day. Furthermore, near-infrared light is highly safe for eyes. Therefore, photodetectors in the near-infrared region are expected to be used in sensors for self-driving cars.

For visible light, silicon (Si) photodetectors are relatively inexpensive and are widely used. However, near-infrared light has a lower energy than visible light and therefore cannot be detected without using a semiconductor with lower band gap energy. Semiconductors with low band gap energy include, for example, indium gallium arsenide (InGaAs).

On the other hand, a photoelectric conversion technique including a Schottky structure in which a metal nanostructure body is disposed on a semiconductor as disclosed in Patent Documents 1 and 2 is attracting attention. Hot electrons generated by surface plasmon resonance in the metal nanostructure body surmount a Schottky barrier, whereby charges are separated and photoelectric conversion is achieved. This technique can use light in a wide wavelength region, including long-wavelength light which has been difficult to use, and is therefore attracting attention in the field of not only photoelectric conversion but also photocatalysts.

In the metal nanostructure body, for example, a metal, such as gold (Au), having excellent plasmonic characteristics can be used. However, the metal having excellent plasmonic characteristics has a high work function and therefore a Schottky barrier formed at the interface between the semiconductor and the metal is high. Therefore, hot electrons are unlikely to surmount the Schottky barrier.

In Non-Patent Document 1, the following improvement is made: a Schottky barrier is reduced by providing titanium (Ti), which is a metal with a relatively low work function, between a semiconductor substrate and Au, which is a metal with excellent plasmonic characteristics.

In the technique of Non-Patent Document 1, a Ti film has low plasmonic characteristics. Therefore, plasmon absorption characteristics of a metal nanostructure body on the semiconductor substrate decrease and the sensitivity and the photoelectric conversion efficiency decrease.

In order to enhance the photoelectric conversion efficiency for infrared light, it is conceivable to use, for example, a structure in which a nanostructure body made of a conductive oxide such as ITO is in contact with a semiconductor such as $SnO_2$, $TiO_2$, or Si as disclosed in Non-Patent Document 2. However, even if such a structure is used, it is difficult to achieve an appropriate Schottky barrier. In a typical application, the height of an appropriate Schottky barrier is, for example, about 0.3 eV to 0.5 eV. Meanwhile, in a structure in which ITO nanoparticles are in contact with $SnO_2$, the height of a Schottky barrier is low, about 0.2 eV. On the other hand, in a structure in which ITO nanoparticles are in contact with $TiO_2$ or Si, the height of a Schottky barrier is high, about 0.7 eV.

The inventors have found the above problem and have devised a novel optical device for solving the problem. A summary of an embodiment of the present disclosure is described below.

An optical device according to an embodiment of the present disclosure includes a nanostructure body which induces surface plasmon resonance when irradiated with light, an alloy layer which is in contact with the nanostructure body and which has a lower work function than the nanostructure body, and an n-type semiconductor in Schottky contact with the alloy layer. The nanostructure body may be composed of one selected from the group consisting of elemental metals, alloys, metal nitrides, and conductive oxides. The alloy layer is composed of at least two metals.

According to the optical device, the alloy layer, which has a lower work function than the nanostructure body, is disposed between the nanostructure body and the n-type semiconductor. This reduces a Schottky barrier and enables the transport efficiency of hot electrons to be enhanced as compared to a configuration in which the n-type semiconductor is in contact with the nanostructure body.

The nanostructure body may contain, for example, at least one elemental metal selected from the group consisting of gold (Au), silver (Ag), copper (Cu), aluminum (Al), and palladium (Pd). Forming the nanostructure body using any one of the above metals, which have excellent plasmonic characteristics and low ionization tendency, enables hot electrons to be generated at high efficiency. Providing an alloy layer having a lower work function than these elemental metals enables the generation of hot electrons at high efficiency and the draw of a current by a low Schottky barrier to be both achieved. This enables the photoelectric conversion efficiency to be enhanced.

The nanostructure body may contain, for example, at least one metal nitride selected from the group consisting of titanium nitride (TiN), zirconium nitride (ZrN), tantalum nitride (TaN), and hafnium nitride (HfN). When the nanostructure body contains the metal nitride, the efficiency of plasmon absorption is high in a visible long-wavelength region to the near-infrared region and the photoelectric conversion efficiency can be enhanced.

The nanostructure body may contain, for example, at least one conductive oxide selected from the group consisting of tin-doped indium oxide (ITO), aluminum-doped zinc oxide (AZO), and gallium-doped zinc oxide (GZO). When the nanostructure body contains the conductive oxide, the efficiency of plasmon absorption in a longer wavelength near-infrared region and the transport efficiency of hot electrons are high and the photoelectric conversion efficiency can be enhanced.

The nanostructure body may be composed of an alloy having a higher work function than the alloy layer. In this case, the nanostructure body may be made of, for example, an intermetallic compound or solid-solution alloy containing a first metal selected from the group consisting of gold (Au), silver (Ag), copper (Cu), aluminum (Al), and palladium (Pd) and a second metal selected from the group consisting of titanium (Ti), chromium (Cr), nickel (Ni), manganese (Mn), iron (Fe), zinc (Zn), gallium (Ga), and tantalum (Ta).

The alloy layer may be made of, for example, an intermetallic compound or solid-solution alloy containing at least two metals selected from the group consisting of gold (Au), silver (Ag), copper (Cu), aluminum (Al), palladium (Pd), titanium (Ti), chromium (Cr), nickel (Ni), manganese (Mn), iron (Fe), zinc (Zn), gallium (Ga), and tantalum (Ta). Incidentally, a combination of metal materials forming the alloy layer is selected such that the alloy layer has a lower work function than the nanostructure body. For example, when the nanostructure body is composed of the first metal only, which has high plasmonic characteristics, the alloy layer may be made of the intermetallic compound or solid-solution alloy of the first metal and the second metal.

The term "intermetallic compound or solid-solution alloy of the first metal and the second metal" as used herein refers to an intermetallic compound or solid-solution alloy mainly containing the first metal and the second metal. The intermetallic compound or the solid-solution alloy may contain an element other than the first metal and the second metal, for example, an impurity. As the second metal, a metal having a lower work function than the first metal may be selected.

Exemplary embodiments of the present disclosure are described below with reference to the attached drawings. Incidentally, unnecessarily detailed descriptions are omitted in some cases. For example, a detailed description of a well-known matter is omitted in some cases. Substantially the same components are given the same reference numerals and overlapping descriptions are omitted in some cases. This is to avoid unnecessary redundancy in descriptions below and to facilitate understanding by those skilled in the art. The inventors provide the attached drawings and the descriptions below to help those skilled in the art to sufficiently understand the present disclosure. The attached drawings and the descriptions below are not intended to limit the subject matters described in the claims.

First Embodiment: Schottky Device

An embodiment of a Schottky device is described as an example of the optical device.

FIG. 1A is a schematic view of an example of a Schottky device 100A according to an exemplary embodiment of the present disclosure. The Schottky device 100A includes a plurality of nanoparticles 11 each of which is a nanostructure body, an alloy layer 12, and an n-type semiconductor 13. The nanoparticles 11 are in contact with the alloy layer 12. The alloy layer 12 is in contact with the n-type semiconductor 13. In this example, the nanoparticles 11 are composed of an elemental metal having excellent plasmonic characteristics. The alloy layer 12 is composed of an alloy containing a metal with a lower work function than the nanoparticles 11. The alloy layer 12 may be composed of a metal material with low electrical resistance. As shown in FIG. 1A, the alloy layer 12 has a uniform filmy structure. The alloy layer 12 is not limited to such a structure and may have, for example, a patchy structure.

According to the above configuration, the alloy layer 12 and the n-type semiconductor 13 are joined together with a large area and therefore the reduction of a Schottky barrier and the enhancement of the transport efficiency of hot electrons are achieved. Using the nanoparticles 11 of an elemental metal enables plasmon absorption at a higher efficiency than using nanoparticles of an alloy. Therefore, an optical device enabling photoelectric conversion at high efficiency can be achieved at relatively low cost.

Components are further described below in detail.

The nanoparticles 11 may be composed of an elemental metal having high conductivity, excellent plasmonic characteristics, and low ionization tendency. The metal may be, for example, one metal selected from the group consisting of gold (Au), silver (Ag), copper (Cu), palladium (Pd), and aluminum (Al).

The nanoparticles 11 have surface plasmon resonance absorption properties. The surface plasmon resonance wavelength of the nanoparticles 11 can be adjusted by varying the particle diameter, shape, and structure of the nanoparticles 11 and the composition of an alloy.

In the present disclosure, the term "particle diameter" refers to the diameter of a circle circumscribed around a particle in a microscopic image including an image of the particle. The particle diameter is hereinafter referred to as the "size" in some cases. In the present disclosure, the term "nanoparticle" refers to a particle with a size which is sufficiently less than the wavelength of light used (typically visible light or near-infrared light) and which is on the order of nanometers (nm). That is, the term "nanoparticle" refers to a particle with a particle diameter of greater than or equal to about 1 nm and less than about 1 µm. The size of the nanoparticles 11 may be, for example, greater than or equal to 1 nm and less than or equal to 200 nm. The size of the nanoparticles 11 may be greater than or equal to 1 nm and less than or equal to 50 nm in an example or may be greater than or equal to 5 nm and less than or equal to 20 nm in another example. Setting the size of the nanoparticles 11 to less than or equal to 200 nm enables plasmon absorption to be enhanced. For example, a microscopic image including images of at least 10 of the nanoparticles 11 is obtained and the arithmetic average of the sizes of the 10 nanoparticles 11 may be determined on the basis of the microscopic image. The arithmetic average may be greater than or equal to 1 nm and less than or equal to 200 nm, may be greater than or equal to 1 nm and less than or equal to 50 nm, or may be greater than or equal to 5 nm and less than or equal to 20 nm. The size of the nanoparticles 11 can be measured using, for example, an electron microscope such as a transmission electron microscope (TEM) or a scanning electron microscope (SEM).

The nanostructure body may have, for example, various structures or shapes such as a wire structure which is long in a certain direction or a cube structure which has a shape close to a cube in addition to the structure of the nanoparticles 11, which are spherical as shown in FIG. 1A. An example in which the nanoparticles 11, which are spherical, are used is described below. The shape of the nanostructure body is not limited to that of a nanoparticle. For example, a nanostructure body 11B which is composed of the same material as that of the nanoparticles 11 and which has a comb-shaped structure may be disposed in contact with the alloy layer 12 instead of the nanoparticles 11 as described below with reference to FIG. 2C. In an example shown in FIG. 1A, all the nanoparticles 11 are composed of the same elemental metal. The nanoparticles 11 are not limited to this example and may be made of different materials.

The alloy layer 12 is made of an intermetallic compound of two or more metals or a solid-solution alloy of two or more metals. Each metal forming the alloy layer 12 may be, for example, one metal selected from the group consisting of gold (Au), silver (Ag), copper (Cu), aluminum (Al), palladium (Pd), titanium (Ti), chromium (Cr), nickel (Ni), manganese (Mn), iron (Fe), zinc (Zn), gallium (Ga), and tantalum (Ta). These metals are selected such that the work function of the alloy layer 12 is lower than the work function of the nanoparticles 11.

The term "intermetallic compound" refers to a compound in which two or more metals are combined at a simple integer ratio and also refers to an alloy in which atoms are regularly arranged over a relatively long distance (for example, 1 nm or more) in an orderly manner. The term "solid-solution alloy" refers to a single-phase alloy in which a plurality of metal elements are uniformly and disorderly distributed in a crystal and which has a structure in which the structure of any one of the metals is maintained and another metal has entered or has substituted.

Whether a material is an alloy can be confirmed by elemental mapping using, for example, a scanning transmission electron microscope (STEM). If the material is unseparated into phases of a plurality of metal elements which are components thereof, the material can be determined to be an alloy. In particular, if the alloy layer 12 meets Conditions (1) and (2) below, the alloy layer 12 can be said to be an alloy of the first metal and the second metal. (1) When the alloy layer 12 is measured by elemental mapping at a resolution of 1 nm×1 nm using a STEM, the first metal and the second metal are detected in 80% or more of all region occupied by the alloy layer 12. (2) The first metal and the second metal are detected in a cross section of a particle at a ratio reflecting the composition ratio by energy dispersive X-ray spectroscopy (EDX) and line analysis.

Whether a material is a solid-solution alloy can be confirmed on the basis of, for example, a diffraction pattern obtained by X-ray diffractometry. If a peak shift, reflecting the composition ratio on the basis of Vegard's law, from the peak position of each of the first metal only and the second metal only is observed in the diffraction pattern, the alloy layer 12 can be determined to be a solid-solution alloy of the first metal and the second metal.

On the other hand, whether the alloy layer 12 is an intermetallic compound can be confirmed by, for example, electron diffractometry or X-ray diffractometry. If a diffraction pattern obtained by electron diffractometry or X-ray diffractometry coincides with a diffraction pattern of an intermetallic compound of the first metal and the second metal that is disclosed in a document such as a specialized book, the alloy layer 12 can be determined to be the intermetallic compound of the first metal and the second metal.

When the composition ratio of an intermetallic compound is different from a composition ratio disclosed in a document, a slight shift in spacing between diffraction spots (in the case of X-ray diffraction, peaks) is sometimes found depending on a shift in interplanar spacing. In this case, lattice spacing is determined from a lattice image obtained by the structural analysis of a particle using a STEM and whether the intermetallic compound is contained may be determined on the basis of whether a peak position calculated from the lattice spacing coincides with a peak position disclosed in a document. Alternatively, the composition ratio of a particle is determined by EDX, lattice spacing is calculated using Vegard's law, and whether the intermetallic compound is contained may be determined on the basis of whether a peak position calculated from the lattice spacing coincides with a peak position disclosed in a document.

The alloy layer 12 has a lower work function than the nanoparticles 11. Thus, a Schottky barrier can be reduced and the efficiency of drawing a current can be enhanced in comparison with a structure in which the nanoparticles 11 are in direct contact with the n-type semiconductor 13. This enables dramatic performance improvement to be achieved in comparison with a case where no alloy layer 12 is present.

The electron affinity of the n-type semiconductor 13 is lower than the work function of the alloy layer 12 and a Schottky junction is established between the n-type semiconductor 13 and the alloy layer 12. This allows the Schottky device 100A to exhibit rectification characteristics.

In this embodiment, the wavelength corresponding to the band gap energy of the n-type semiconductor 13 may be shorter than the surface plasmon resonance wavelength of the nanoparticles 11. In other words, the energy of light causing surface plasmon resonance in the nanoparticles 11, that is, the energy of irradiation light, may be lower than the band gap energy of the n-type semiconductor 13. Even when the energy of irradiation light is lower than the band gap energy of the n-type semiconductor 13, if generated hot electrons surmount a Schottky barrier, charges are separated.

The n-type semiconductor 13 may include, for example, at least one selected from the group consisting of silicon (Si) semiconductors, germanium (Ge) semiconductors, and gallium arsenide (GaAs) semiconductors. The n-type semiconductor 13 may be a Si semiconductor, a Ge semiconductor, or a GaAs semiconductor. In this case, the surface plasmon resonance wavelength in the nanoparticles 11 may be, for example, greater than or equal to 900 nm. The n-type semiconductor 13 may be a wide-gap semiconductor. The wide-gap semiconductor may include at least one selected from the group consisting of titanium oxide ($TiO_2$) semiconductors, gallium nitride (GaN) semiconductors, and strontium titanate ($SrTiO_3$) semiconductors. The wide-gap semiconductor may be a titanium oxide ($TiO_2$) semiconductor, a gallium nitride (GaN) semiconductor, or a strontium titanate ($SrTiO_3$) semiconductor. When the n-type semiconductor 13 is the wide-gap semiconductor, the surface plasmon resonance wavelength in the nanoparticles 11 may be, for example, greater than or equal to 400 nm. As described above, the n-type semiconductor 13 may be, for example, an inorganic semiconductor.

Hitherto, for light with a wavelength of 900 nm or less, Si semiconductors for which a technique for preparing a high-quality crystal has been established have been used, thereby achieving high-sensitivity light detection. For near-infrared light with an energy lower than the band gap energy of the Si semiconductors, InGaAs semiconductors epitaxially grown on InP single-crystal substrates have been used, thereby achieving high sensitivity. However, an advanced thin film-forming technique is necessary to prepare the InGaAs semiconductors. According to this embodiment, even in the case of using the Si semiconductor, the Ge semiconductor, the GaAs semiconductor, or the wide-gap semiconductor, light in the near-infrared region can be detected. No advanced thin film-forming technique is necessary to prepare these semiconductors and therefore these semiconductors enable cost reduction. In particular, in the case of using the Si semiconductor, the dark current can be reduced in comparison with the InGaAs semiconductors.

Hitherto, a structure in which a metal film with a low work function is disposed between an n-type semiconductor substrate and a metal which causes surface plasmon resonance as disclosed in Non-Patent Document 1 has been known. However, no attempt has been made to provide the alloy layer 12, which reduces a plasmon barrier, between the nanoparticles 11, which cause surface plasmon resonance, and the n-type semiconductor 13 as described in this embodiment. Using a structure described in this embodiment enables a photoelectric conversion device with high efficiency to be prepared by a simple method such as a nanoink application process.

An oxide film is sometimes formed on a surface of a substrate of the n-type semiconductor 13 or a surface of the alloy layer 12 depending on a film formation process used to prepare the Schottky device 100A. In this case, a step of removing the oxide film may be included in a manufacturing process.

Figure 1B:
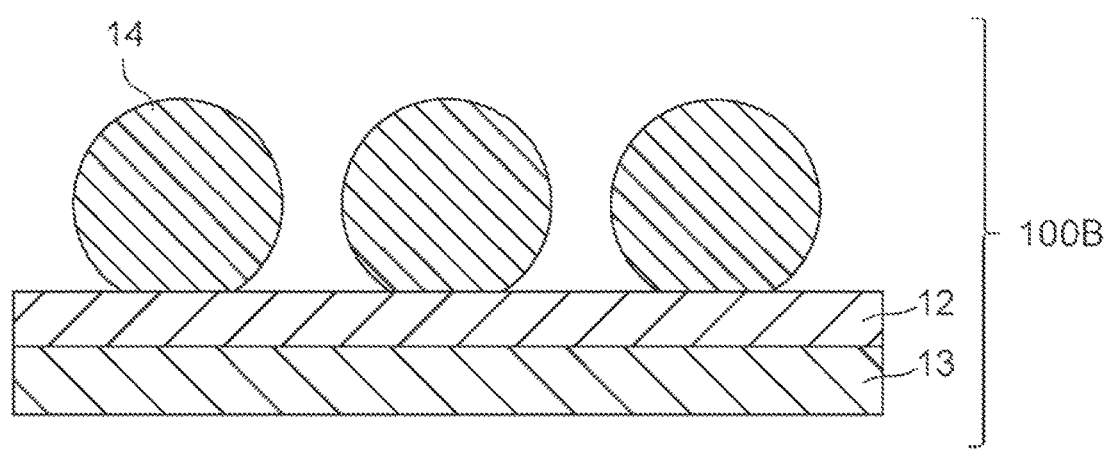
FIG. 1B is a schematic view of a Schottky device according to a modification.

FIG. 1B is a schematic view of a Schottky device 100B according to a modification of this embodiment. In this modification, the Schottky device 100B differs from the configuration shown in FIG. 1A in that nanoparticles 14 which are nanostructure bodies made of a metal nitride are disposed on an alloy layer 12.

In this modification, the nanoparticles 14 may be composed of, for example, at least one metal nitride selected from the group consisting of titanium nitride (TiN), zirconium nitride (ZrN), tantalum nitride (TaN), and hafnium nitride (HfN).

These metal nitrides have high plasmon absorption characteristics for light in the visible long-wavelength region to the near-infrared region. Therefore, the efficiency of plasmon absorption for light in the visible long-wavelength region to the near-infrared region and the transport efficiency of hot electrons are high and the photoelectric conversion efficiency can be enhanced.

Figure 1C:
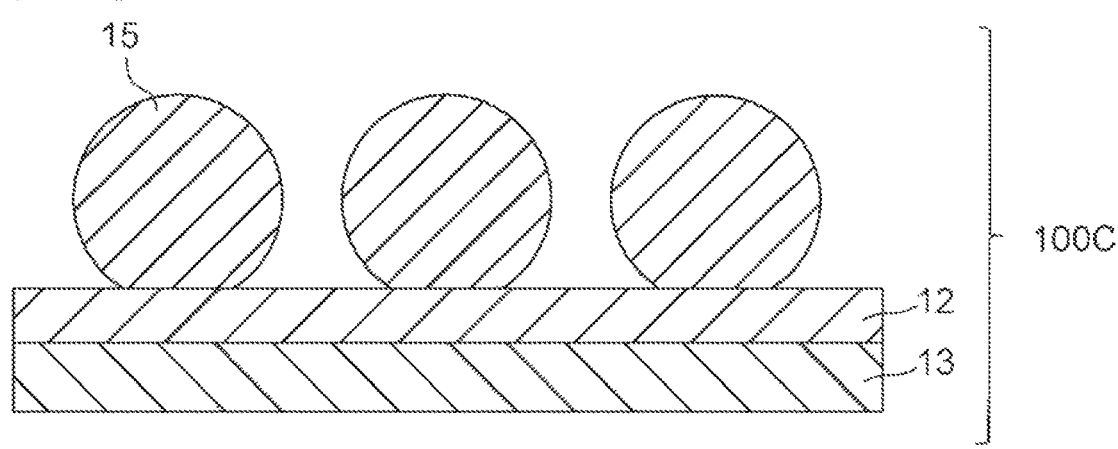
FIG. 1C is a schematic view of a Schottky device according to another modification.

FIG. 1C is a schematic view of a Schottky device 100C according to another modification of this embodiment. The Schottky device 100C differs from the configurations shown in FIGS. 1A and 1B in that nanoparticles 15 which are nanostructure bodies made of a conductive oxide are disposed on an alloy layer 12.

In this modification, the nanoparticles 15 may be composed of, for example, at least one conductive oxide selected from the group consisting of tin-doped indium oxide (ITO), aluminum-doped zinc oxide (AZO), and gallium-doped zinc oxide (GZO).

These conductive oxides have high plasmon absorption characteristics for light in a longer wavelength near-infrared region. Therefore, the efficiency of plasmon absorption for light in the longer wavelength near-infrared region and the transport efficiency of hot electrons are high and the photoelectric conversion efficiency can be enhanced.

Figure 1D:
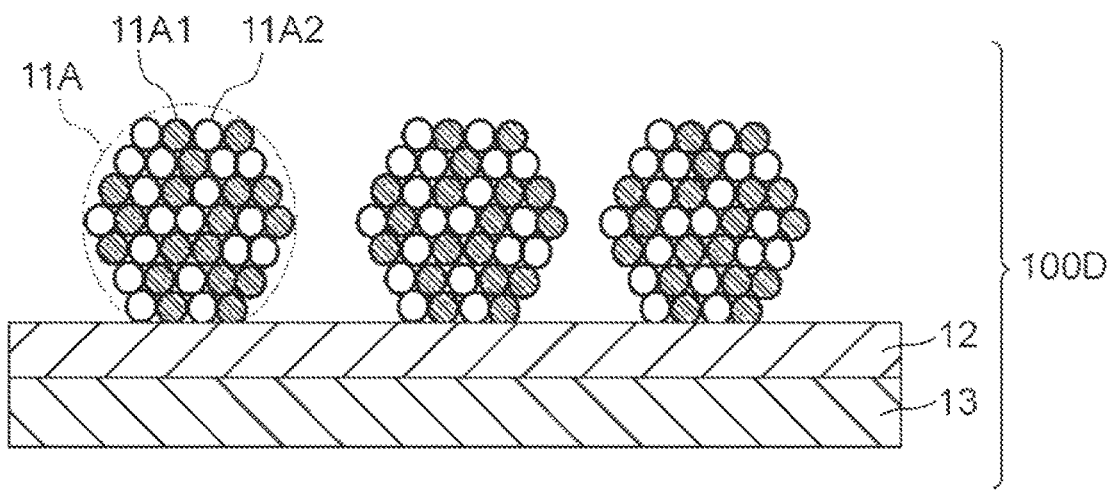
FIG. 1D is a schematic view of a Schottky device according to still another modification.

FIG. 1D is a schematic view of a Schottky device 100D according to still another modification of this embodiment. The Schottky device 100D differs from the configurations shown in FIGS. 1A to 1C in that nanoparticles 11A which are nanostructure bodies made of an alloy are disposed on an alloy layer 12.

In this modification, the nanoparticles 11A are made of an intermetallic compound or solid-solution alloy containing a first metal 11A1 and a second metal 11A2. The first metal 11A1 has excellent plasmonic characteristics and low ionization tendency. The second metal 11A2 has a lower work function than the first metal 11A1. The composition of the nanoparticles 11A is different from the composition of the alloy layer 12.

The first metal 11A1 may be composed of a material having high conductivity, excellent plasmonic characteristics, and low ionization tendency. The first metal 11A1 may be, for example, one or more metals selected from the group consisting of gold (Au), silver (Ag), copper (Cu), palladium (Pd), and aluminum (Al).

The second metal 11A2 may be composed of a material having a lower work function than the first metal 11A1. The second metal 11A2 may be, for example, one or more metals selected from the group consisting of titanium (Ti), chromium (Cr), silver (Ag), copper (Cu), aluminum (Al), nickel (Ni), manganese (Mn), iron (Fe), zinc (Zn), gallium (Ga), and tantalum (Ta).

As described above, the nanostructure bodies may be composed of an alloy having a higher work function than the alloy layer 12.

Figure 1E:
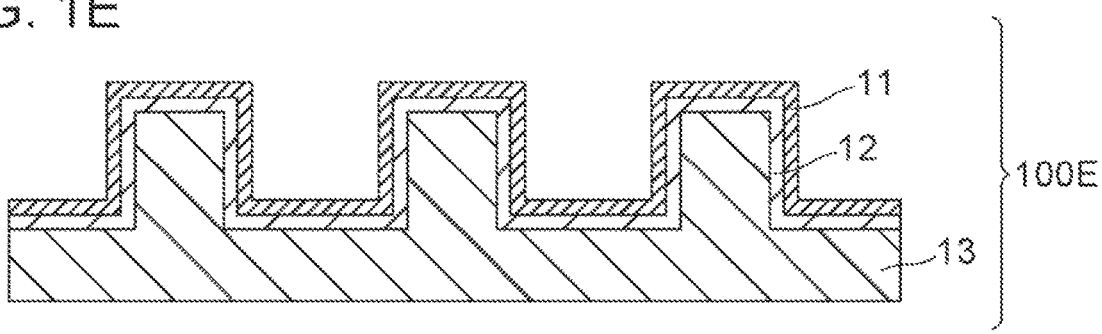
FIG. 1E is a schematic view of a Schottky device according to still another modification.

FIG. 1E is a schematic view of a Schottky device 100E according to still another modification of this embodiment. In this modification, the Schottky device 100E includes an n-type semiconductor 13 having a trench structure or a texture structure. An upper section of the n-type semiconductor 13 is covered by an alloy layer 12 and an elemental-metal layer 11. In this modification, a surface of the Schottky device 100E has a plurality of recesses or protrusions. The center-to-center distance between two neighboring recesses or protrusions may be on the order of nanometers, that is, greater than or equal to 1 nm and less than 1 μm. In such a structure, the elemental-metal layer 11, which is the outermost layer, functions as a nanostructure body which induces surface plasmon resonance. According to a configuration shown in FIG. 1E, the efficiency of plasmon absorption is high due to a nanoantenna structure and the photoelectric conversion efficiency can be enhanced.

Figure 1F:
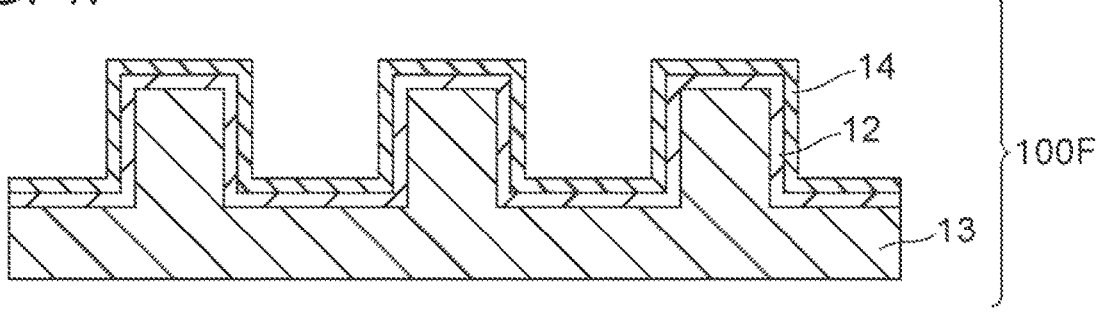
FIG. 1F is a schematic view of a Schottky device according to still another modification.

FIG. 1F is a schematic view of a Schottky device 100F according to still another modification of this embodiment. In this modification, the Schottky device 100F includes an n-type semiconductor 13 having a trench structure or a texture structure and an upper section of the n-type semiconductor 13 is covered by an alloy layer 12 and a metal nitride layer 14. In such a structure, the metal nitride layer 14, which is the outermost layer, functions as a nanostructure body which induces surface plasmon resonance. According to a configuration shown in FIG. 1F, the efficiency of plasmon absorption for light in the visible long-wavelength region to the near-infrared region is high and the photoelectric conversion efficiency can be enhanced. The metal nitride layer 14 can be formed using, for example, at least one metal nitride selected from the group consisting of titanium nitride (TiN), zirconium nitride (ZrN), tantalum nitride (TaN), and hafnium nitride (HfN).

Figure 1G:
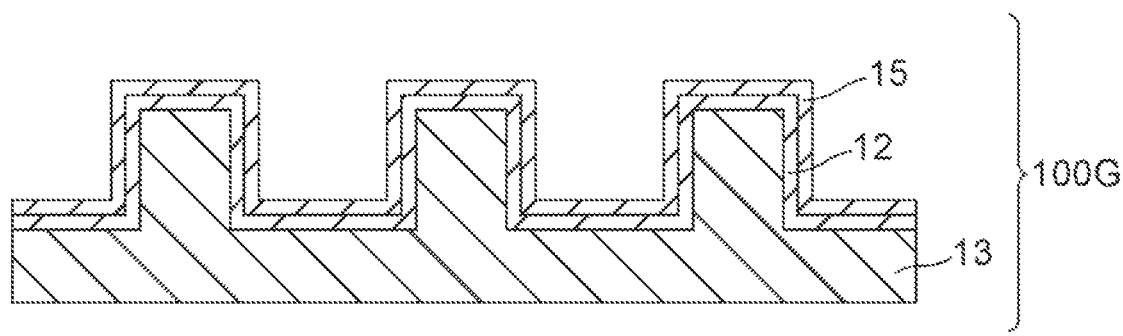
FIG. 1G is a schematic view of a Schottky device according to still another modification.

FIG. 1G is a schematic view of a Schottky device 100G according to still another modification of this embodiment. In this modification, the Schottky device 100G includes an n-type semiconductor 13 having a trench structure or a texture structure and an upper section of the n-type semiconductor 13 is covered by an alloy layer 12 and a conductive oxide layer 15. In such a structure, the conductive oxide layer 15, which is the outermost layer, functions as a nanostructure body which induces surface plasmon resonance. According to a configuration shown in FIG. 1G, the efficiency of plasmon absorption for light in a longer wavelength near-infrared region is high and the photoelectric conversion efficiency can be enhanced. The conductive oxide layer 15 can be formed using, for example, at least one conductive oxide selected from the group consisting of tin-doped indium oxide (ITO), aluminum-doped zinc oxide (AZO), and gallium-doped zinc oxide (GZO).

Figure 1H:
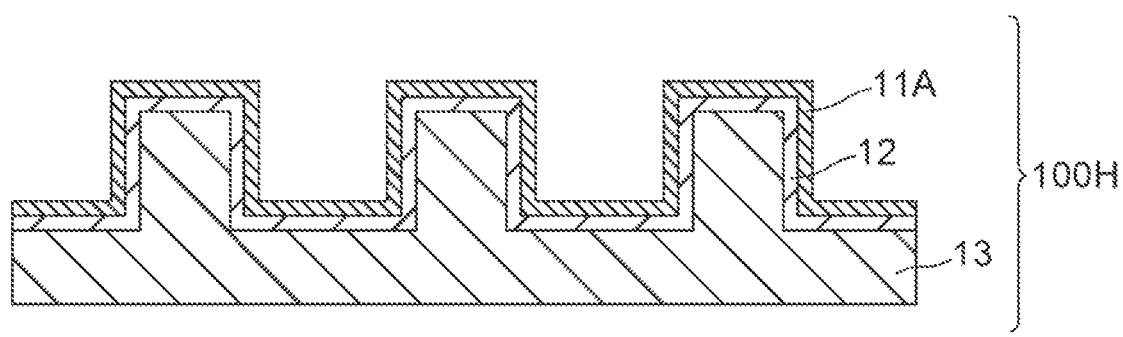
FIG. 1H is a schematic view of a Schottky device according to still another modification.

FIG. 1H is a schematic view of a Schottky device 100H according to still another modification of this embodiment. The Schottky device 100H differs from the configurations shown in FIGS. 1E to 1G in that an alloy layer 12 is covered by an alloy layer 11A different in composition from the alloy layer 12. The alloy layer 11A has a higher work function than the alloy layer 12. In such a structure, the alloy layer 11A, which is the outermost layer, functions as a nanostructure body which induces surface plasmon resonance. As described above, the alloy layer 12 may be covered by the alloy layer 11A, which has a higher work function.

Next, examples of the arrangement of nanostructure bodies are described with reference to FIGS. 2A to 2C.

Figure 2A:
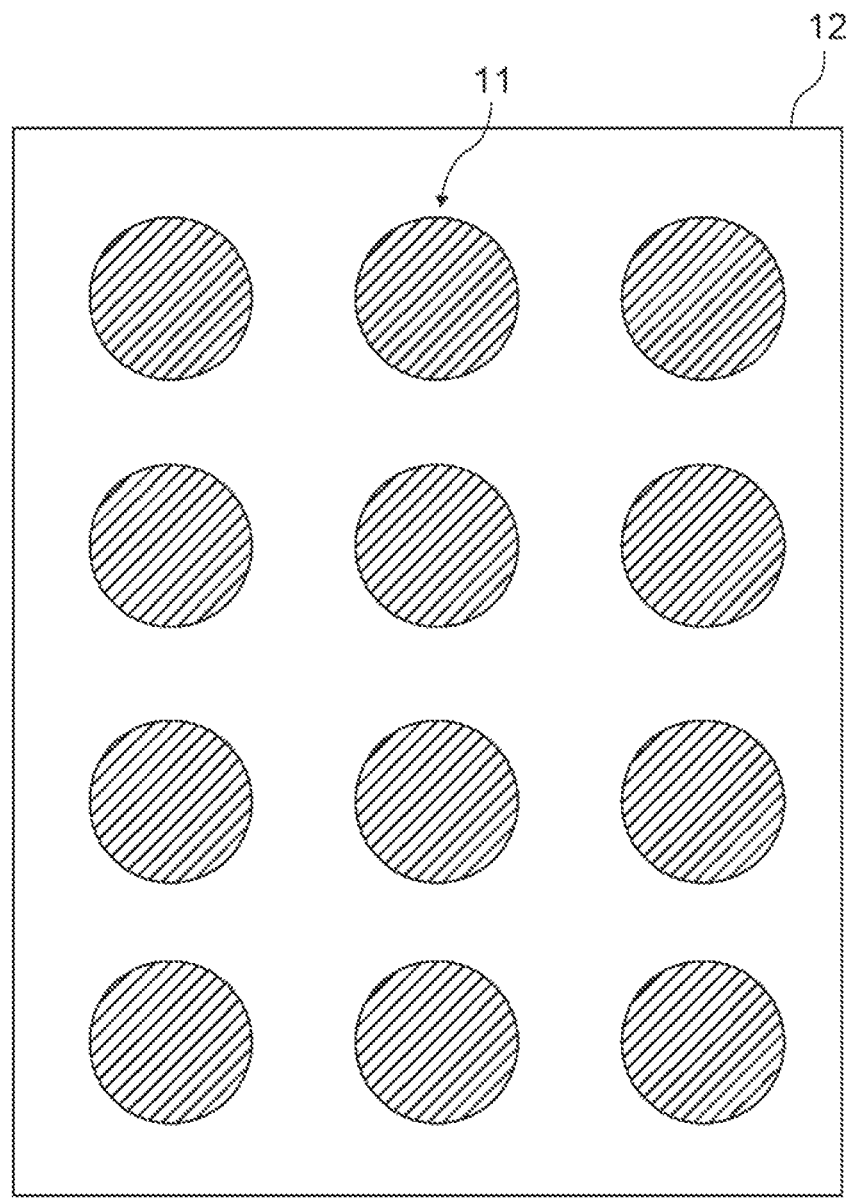
FIG. 2A is a top view of an example of the arrangement of a plurality of nanoparticles in the Schottky device shown in FIG. 1A.

FIG. 2A is a top view of an example of the arrangement of the nanoparticles 11 in the Schottky device 100A shown in FIG. 1A. As shown in this example, the nanoparticles 11 may be two-dimensionally periodically arranged. The nanoparticles 11 may be one-dimensionally arranged. The period of the arrangement of the nanoparticles 11 is not particularly limited. The period of the arrangement of the nanoparticles 11 may be set to a period about twice the size of the nanoparticles 11.

Figure 2B:
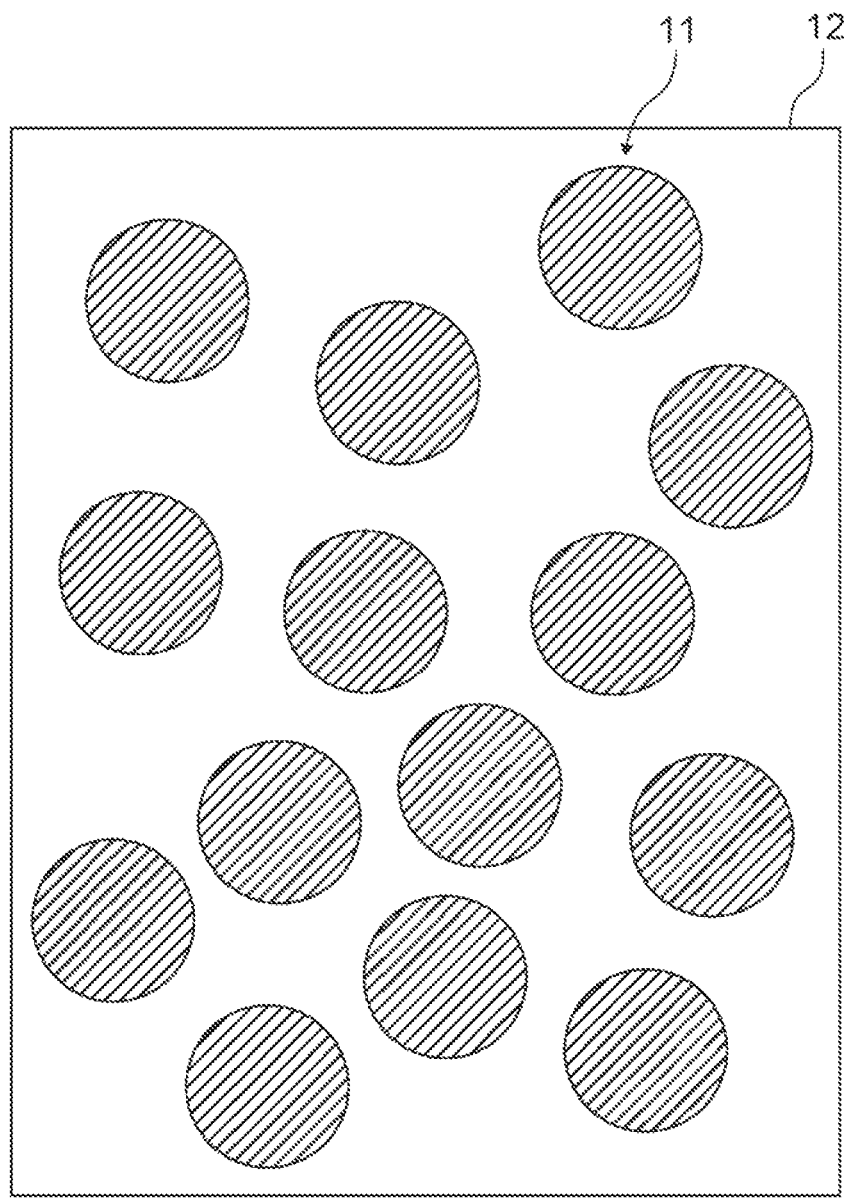
FIG. 2B is a top view of another example of the arrangement of the nanoparticles in the Schottky device shown in FIG. 1A.

FIG. 2B is a top view of another example of the arrangement of the nanoparticles 11 in the Schottky device 100A shown in FIG. 1A. In this example, the nanoparticles 11 have no clear periodicity and are arranged at random or pseudo random. Even in this arrangement, an effect of this embodiment can be obtained without any problems.

Similarly in the configuration shown in any one of FIGS. 1B to 1D besides FIG. 1A, the arrangements shown in FIGS. 2A and 2B may be used.

Incidentally, the structure of a plurality of nanoparticles need not be uniform and the nanoparticles may be different in size, shape, and material from each other. Furthermore, even when a single nanoparticle rather than a plurality of nanoparticles is disposed, an effect of this embodiment can be obtained.

In the structure shown in each of FIGS. 1E to 1H, the nanostructure body may have a one- or two-dimensional periodic structure or an aperiodic structure.

Figure 2C:
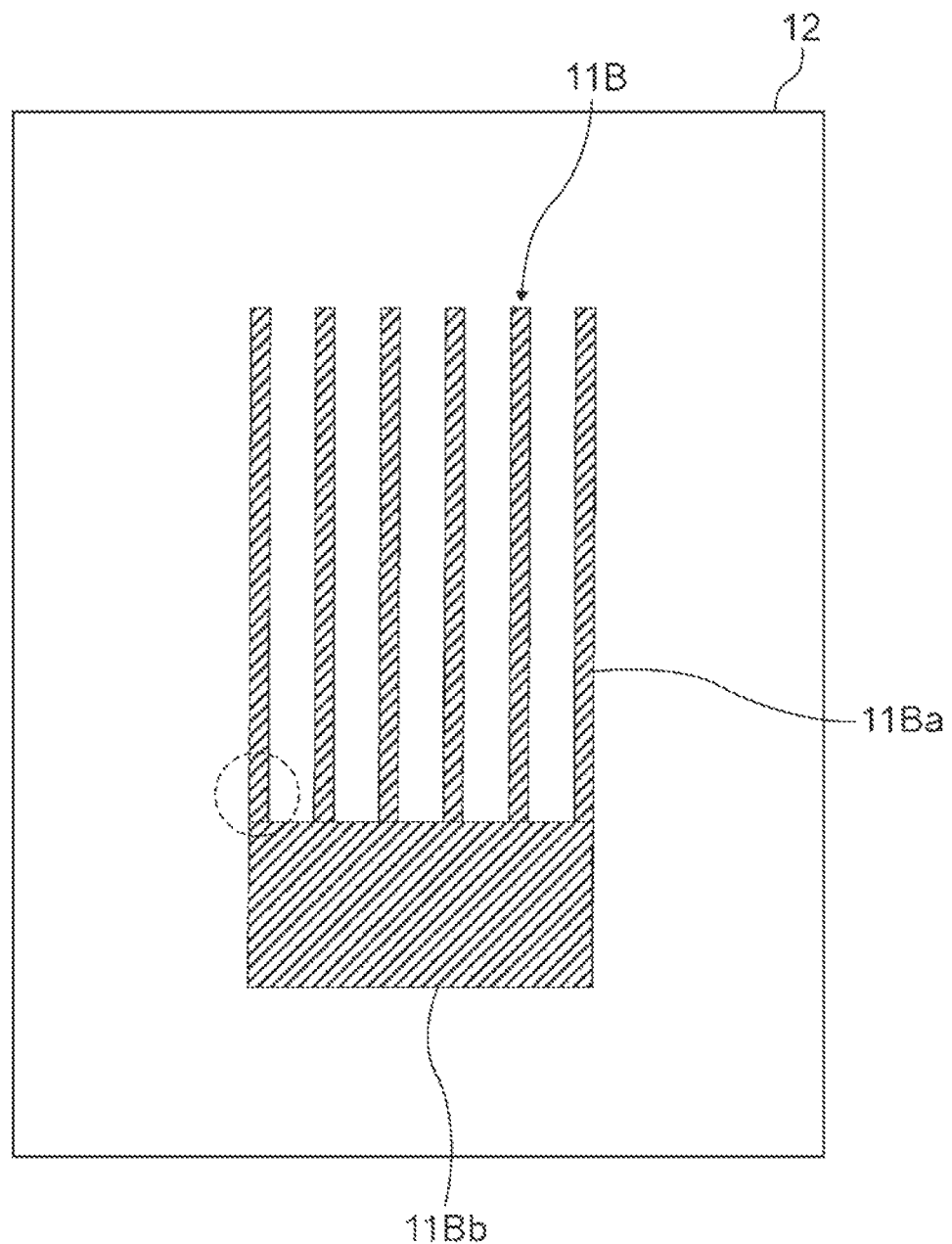
FIG. 2C is a top view of an example of a Schottky device including a nanostructure body having a comb-shaped structure.

FIG. 2C is a top view of a Schottky device according to still another modification of this embodiment. In this modification, the Schottky device includes a nanostructure body 11B having a comb-shaped structure. In this modification, the nanostructure body 11B includes a plurality of sections 11Ba extending in one direction and a section 11Bb connecting end portions of the sections 11Ba. Each of the sections 11Ba, which extend in one direction, has a diameter on the order of nanometers and functions as a nanowire. This structure allows the sections 11Ba of the nanostructure body 11B to be electrically connected to each other with the section 11Bb.

Figure 2D:
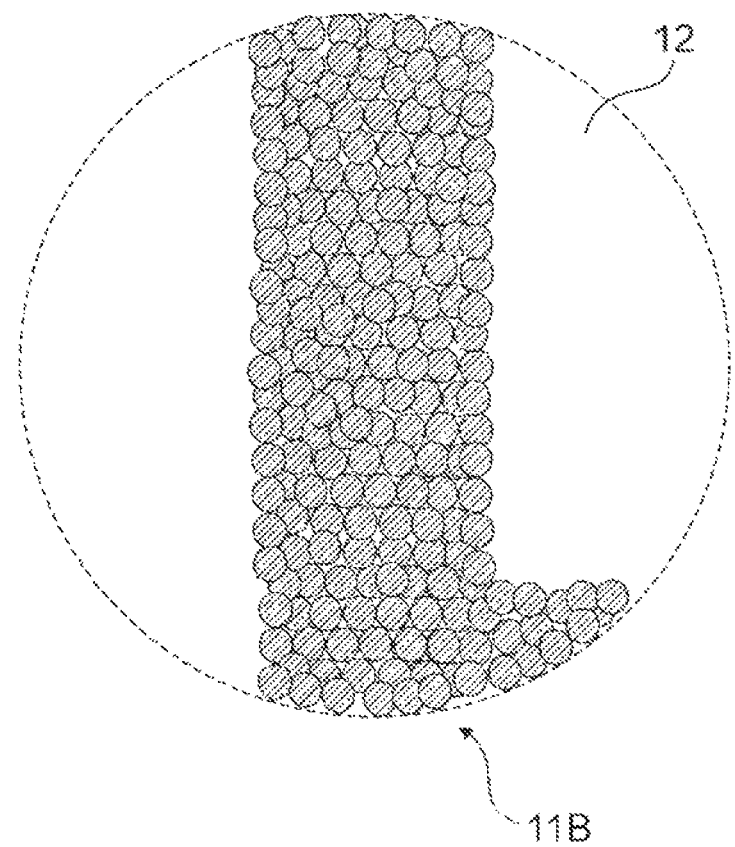
FIG. 2D is an enlarged view of a structure in a dashed line frame shown in FIG. 2C.

FIG. 2D is a schematic view of an example of the structure of a region surrounded by a dashed line circle shown in FIG. 2C. Referring to FIG. 2D, metal atoms are represented by spheres. As shown in FIG. 2D, the nanostructure body 11B is formed of an elemental metal. The nanostructure body 11B may have a size larger than a nanometer scale as a whole. Even in this case, each nanowire section of the nanostructure body 11B, which is comb-shaped, functions as an antenna and therefore an effect due to surface plasmon resonance can be obtained. The material of such a nanowire structure as shown in FIG. 2C is not limited to an elemental metal and may be a metal nitride, a conductive oxide, or an alloy like examples shown in FIGS. 1B to 1D.

Second Embodiment: Photoelectric Converter

Next, an embodiment of a photoelectric converter including a Schottky device is described.

Figure 3A:
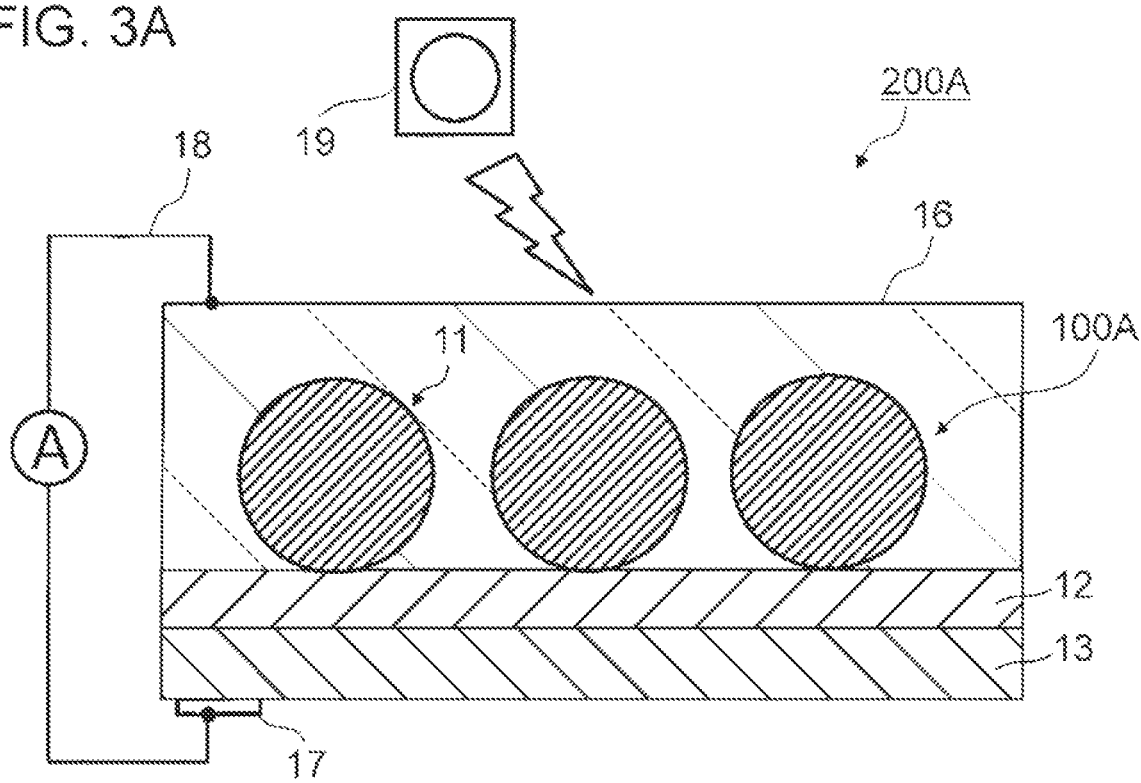
FIG. 3A is a schematic view of the configuration of a photoelectric converter including the Schottky device shown in FIG. 1A.

FIG. 3A is a schematic view of the configuration of a photoelectric converter 200A including the Schottky device 100A shown in FIG. 1A. Irradiating the photoelectric converter 200A with light from a light source 19 generates a current.

The photoelectric converter 200A includes the Schottky device 100A, which is an optical device; an ohmic electrode 17 (also referred to as the first electrode) that is in contact with the n-type semiconductor 13 on the side opposite to the side on which the nanoparticles 11 are located; and a conductor 18 that electrically connects the ohmic electrode 17 and the nanoparticles 11. The photoelectric converter 200A further includes a transparent conductive film 16 disposed on a surface of the alloy layer 12 that is provided with the nanoparticles 11. The transparent conductive film 16 covers the nanoparticles 11. The transparent conductive film 16 is not in contact with the n-type semiconductor 13. The conductor 18 electrically connects the ohmic electrode 17 and the transparent conductive film 16.

The photoelectric converter 200A is prepared by forming the transparent conductive film 16, the ohmic electrode 17, and the conductor 18 on the Schottky device 100A.

In the transparent conductive film 16, a material with high transmittance at the wavelength of light emitted from the light source 19 can be used. In particular, in the visible to near-infrared region, for example, tin-doped indium oxide (ITO), gallium-doped zinc oxide (GZO), aluminum-doped zinc oxide (AZO), or the like may be used.

The light source 19 emits light toward the nanoparticles 11 in the Schottky device 100A. An example of the light source 19 may be a laser, a xenon lamp, a mercury lamp, or a halogen lamp. The light source 19 emits light having an energy which is lower than or equal to the band gap energy of the n-type semiconductor 13 and which corresponds to the plasmon resonance wavelength of the nanoparticles 11. The light source 19 may emit light in a relatively wide wavelength range. The wavelength range is determined so as to cover the surface plasmon resonance wavelength of the nanoparticles 11. The light source 19 may be a component of the photoelectric converter 200A or an element outside the photoelectric converter 200A. When the Schottky device 100A is irradiated with light from the light source 19, a current flows through the conductor 18.

According to the above configuration, a Schottky barrier can be reduced at relatively low cost. As a result, a device which performs photoelectric conversion at higher efficiency can be achieved.

Figure 3B:
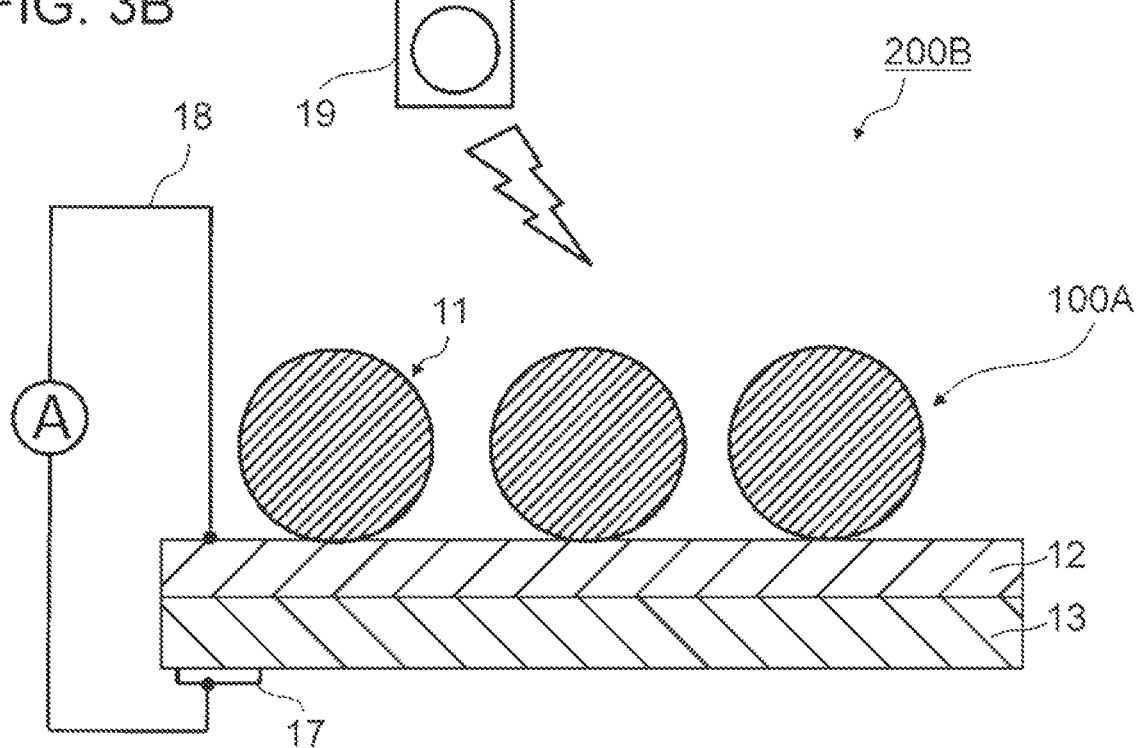
FIG. 3B is a schematic view of the configuration of a modification of the photoelectric converter.

FIG. 3B is a schematic view of a photoelectric converter 200B according to a modification of the second embodiment. In this modification, the photoelectric converter 200B includes no transparent conductive film 16 shown in FIG. 3A. An alloy layer 12 and an ohmic electrode 17 are electrically connected through a conductor 18. When the Schottky device 100A is irradiated with light from a light source 19, a current flows through the conductor 18.

According to the above configuration, the natural oxidation of a metal with a low work function can be suppressed and a Schottky barrier can be reduced at relatively low cost. As a result, a device which performs photoelectric conversion at higher efficiency can be achieved.

In examples shown in FIGS. 3A and 3B, a current is generated by irradiating the Schottky devices 100A and 100B with light. The generated current can be drawn outside through the conductor 18. The wavelength of usable light can be controlled in such a manner that the surface plasmon resonance wavelength is controlled by adjusting the structure of the nanoparticles 11.

In this embodiment, an example including the Schottky device 100A shown in FIG. 1A has been described. For example, a photoelectric converter including any one of the Schottky devices shown in FIGS. 1B to 2D may be composed without being limited to these configurations.

Third Embodiment: Fuel Generator

Next, an embodiment of a fuel generator including a Schottky device is described as another example of an optical device.

Figure 3C:
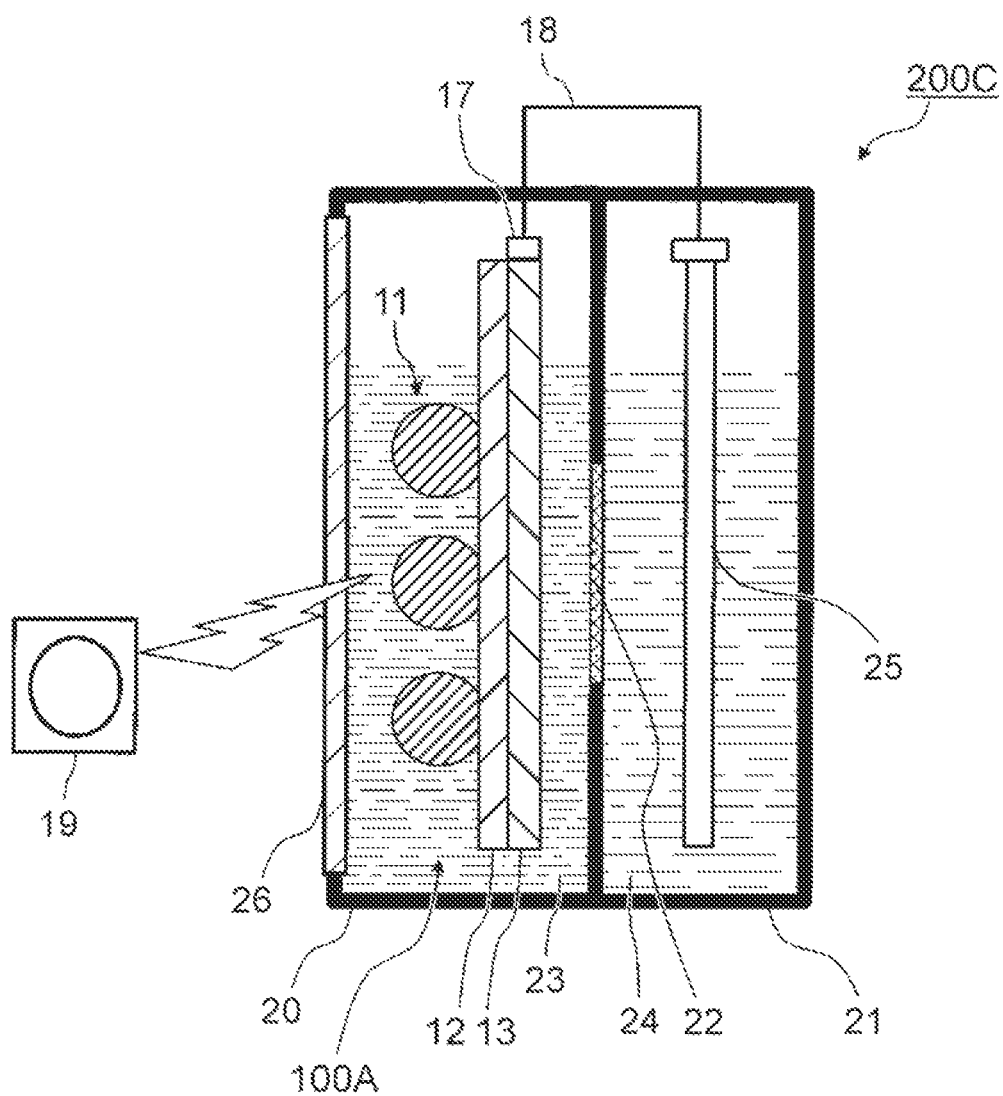
FIG. 3C is a schematic view of an example of a fuel generator including the Schottky device shown in FIG. 1A.

FIG. 3C is a schematic view of an example of a fuel generator 200C including the Schottky device 100A shown in FIG. 1A. When the fuel generator 200C is irradiated with light from a light source 19, the fuel generator 200C performs photoelectric conversion and, furthermore, generates fuel by a photochemical reaction. The fuel generator 200C includes an oxidation reaction tank 20, a reduction reaction tank 21, a proton-permeable membrane 22, the Schottky device 100A, a reduction electrode 25, an ohmic electrode 17, a conductor 18, and a quartz glass window 26. A first electrolytic solution 23 is held in the oxidation reaction tank 20. A second electrolytic solution 24 is held in the reduction reaction tank 21. The oxidation reaction tank 20 and the reduction reaction tank 21 are separated by the proton-permeable membrane 22. The Schottky device 100A is at least partly immersed in the first electrolytic solution 23. The reduction electrode 25 is at least partly immersed in the second electrolytic solution 24. An end portion of the n-type semiconductor 13 is provided with the ohmic electrode 17 (also referred to as the first electrode). The first electrode 17 is electrically connected to the reduction electrode 25 (also referred to as the second electrode) through the conductor 18.

An example of the first electrolytic solution 23 in the oxidation reaction tank 20 is an aqueous solution containing at least one selected from the group consisting of potassium hydrogen carbonate ($KHCO_3$), sodium hydrogen carbonate ($NaHCO_3$), potassium hydroxide (KOH), and sodium hydroxide (NaOH). The concentration of an electrolyte in the first electrolytic solution 23 may be set to, for example, 0.1 mol/L or more. The first electrolytic solution 23 may be, for example, basic. The second electrolytic solution 24 in the reduction reaction tank 21 may be an electrolytic solution generally used. The second electrolytic solution 24 used may be, for example, an aqueous solution containing at least one selected from the group consisting of potassium hydrogen carbonate ($KHCO_3$), sodium hydrogen carbonate ($NaHCO_3$), potassium chloride (KCl), and sodium chloride (NaCl). When the second electrolytic solution 24 contains any electrolyte, the concentration of the electrolyte in the second electrolytic solution 24 may be set to, for example, 0.1 mol/L or more. The second electrolytic solution 24 may be, for example, acidic.

The quartz glass window 26 is disposed in a side surface of the oxidation reaction tank 20. A region of the Schottky device 100A that is located on the light irradiation side of the Schottky device 100A and that is immersed in the first electrolytic solution 23 is irradiated with light from the light source 19 through the quartz glass window 26. The proton-permeable membrane 22 is interposed between the oxidation reaction tank 20 and the reduction reaction tank 21 and therefore the first electrolytic solution 23 and the second electrolytic solution 24 are not mixed with each other. The structure of the proton-permeable membrane 22 is not particularly limited and may be one through which protons ($H^+$) pass and in which the passage of other substances is inhibited. A specific example of the proton-permeable membrane 22 is a Nafion® membrane.

The first electrode 17 may be made of, for example, platinum, an alloy containing platinum, or a platinum compound. When light with an energy corresponding to the surface plasmon resonance wavelength is incident on the nanoparticles 11, hydrogen is generated on the second electrode 25.

According to the above configuration, a Schottky barrier can be reduced at relatively low cost. Therefore, a device capable of performing photoelectric conversion and fuel generation at higher efficiency can be achieved.

In an example shown in FIG. 3C, the reduction electrode 25 is appropriately placed in the reduction reaction tank 21 and the Schottky device 100A is irradiated with light, whereby fuel is generated. As a result, for example, hydrogen ($H_2$) or the like can be generated in the form of a reduction product. The type of product can be changed by selecting the type of material of the catalyst layer used.

In this embodiment, the fuel generator 200C may include any one of the Schottky devices shown in FIGS. 1B to 2D instead of the Schottky device 100A shown in FIG. 1A.

As described above, an optical device according to an embodiment of the present disclosure includes a nanostructure body which induces surface plasmon resonance when irradiated with light and which is composed of one selected from the group consisting of elemental metals, alloys, metal nitrides, and conductive oxides; an alloy layer which is in contact with the nanostructure body and which has a lower work function than the nanostructure body; and an n-type semiconductor which is in Schottky contact with the alloy layer.

According to the above configuration, the alloy layer, which has a lower work function than the nanostructure body, is disposed between the nanostructure body and the n-type semiconductor. This enables a Schottky barrier to be reduced. Therefore, the transport efficiency of hot electrons generated from the nanostructure body can be enhanced and the photoelectric conversion efficiency can be enhanced.

The nanostructure body may contain at least one elemental metal selected from the group consisting of gold (Au), silver (Ag), copper (Cu), aluminum (Al), and palladium (Pd).

According to this configuration, a metal with excellent plasmonic characteristics is used. Therefore, plasmonic characteristics of the nanostructure body can be enhanced and the photoelectric conversion efficiency can be enhanced.

The nanostructure body may contain at least one metal nitride selected from the group consisting of titanium nitride (TiN), zirconium nitride (ZrN), tantalum nitride (TaN), and hafnium nitride (HfN).

According to this configuration, the efficiency of plasmon absorption for light in the visible long-wavelength region to the near-infrared region and the transport efficiency of hot electrons are high and the photoelectric conversion efficiency can be enhanced.

The nanostructure body may contain at least one conductive oxide selected from the group consisting of tin-doped indium oxide (ITO), aluminum-doped zinc oxide (AZO), and gallium-doped zinc oxide (GZO).

According to this configuration, the efficiency of plasmon absorption for light in a longer wavelength near-infrared region and the transport efficiency of hot electrons are high and the photoelectric conversion efficiency can be enhanced.

The alloy layer may be made of an intermetallic compound or solid-solution alloy containing at least two metals selected from the group consisting of gold (Au), silver (Ag), copper (Cu), aluminum (Al), palladium (Pd), titanium (Ti), chromium (Cr), nickel (Ni), manganese (Mn), iron (Fe), zinc (Zn), gallium (Ga), and tantalum (Ta).

The n-type semiconductor may be an inorganic semiconductor.

The nanostructure body may have a comb-shaped structure.

The nanostructure body may include at least one nanoparticle. The particle diameter of the at least one nanoparticle may be greater than or equal to 1 nm and less than or equal to 200 nm.

According to this configuration, the photoelectric conversion efficiency can be further enhanced by providing, for example, a plurality of nanoparticles.

The optical device may further include a light source that emits light having an energy which is lower than or equal to the band gap energy of the n-type semiconductor and which corresponds to the plasmon resonance wavelength of the nanostructure body.

The n-type semiconductor may include at least one selected from the group consisting of silicon semiconductors, germanium semiconductors, and gallium arsenide semiconductors. The surface plasmon resonance wavelength of the nanostructure body may be greater than or equal to 900 nm.

The n-type semiconductor may include at least one selected from the group consisting of titanium oxide ($TiO_2$) semiconductors, gallium nitride (GaN) semiconductors, and strontium titanate (SrTiO$_3$) semiconductors. The surface plasmon resonance wavelength of the nanostructure body may be greater than or equal to 400 nm.

A photoelectric converter according to an embodiment of the present disclosure includes the above-mentioned optical device, an electrode, and a conductor that electrically connects the electrode and the nanostructure body. The n-type semiconductor has a first surface that is in contact with the alloy layer and a second surface that is opposite to the first surface. The electrode is in contact with the second surface of the n-type semiconductor.

The photoelectric converter may further include a transparent conductive film that covers the nanostructure body. The transparent conductive film need not be in contact with the n-type semiconductor. The conductor may electrically connect the electrode and the transparent conductive film.

A fuel generator according to an embodiment of the present disclosure includes the above-mentioned optical device, a first electrode that is in contact with the n-type semiconductor in the optical device, an oxidation reaction tank that contains a first electrolytic solution and the optical device, a reduction reaction tank that contains a second electrolytic solution and a second electrode, a proton-permeable membrane that is located at the boundary between the oxidation reaction tank and the reduction reaction tank, and a conductor that connects the first electrode and the second electrode. The optical device is in contact with the first electrolytic solution. The second electrode is in contact with the second electrolytic solution.

The first electrode may be made of platinum, an alloy containing platinum, or a platinum compound. When light with an energy corresponding to the surface plasmon resonance wavelength of the first metal is incident on the intermetallic compound or solid-solution alloy in the optical device, hydrogen may be generated on the second electrode.

According to this configuration, hydrogen can be obtained by water splitting using the first electrode which contains platinum.

The first electrolytic solution may be an aqueous solution containing at least one selected from the group consisting of potassium hydrogen carbonate (KHCO$_3$), sodium hydrogen carbonate (NaHCO$_3$), potassium hydroxide (KOH), and sodium hydroxide (NaOH).

The second electrolytic solution may be an aqueous solution containing at least one selected from the group consisting of potassium hydrogen carbonate (KHCO$_3$), sodium hydrogen carbonate (NaHCO$_3$), potassium chloride (KCl), and sodium chloride (NaCl).

A technique of the present disclosure can be used for any application in which photoelectric conversion is performed. The technique can be used for, for example, photodetectors such as image sensors, fuel generators, and the like.

What is claimed is:

1. An optical device comprising:
a surface plasmon resonance inducing layer that includes a nanostructure body comprising one selected from the group consisting of elemental metals, alloys, metal nitrides, and conductive oxides, the nanostructure body inducing surface plasmon resonance when irradiated with light;
an alloy layer comprising at least two metals, the alloy layer being in contact with the surface plasmon resonance inducing layer and having a lower work function than the nanostructure body; and
an n-type semiconductor, the n-type semiconductor being in Schottky contact with the alloy layer, wherein the surface plasmon resonance inducing layer is disposed on top of the alloy layer,
the alloy layer comprises an intermetallic compound or solid-solution alloy of a first metal and a second metal that are different in work function from each other, and
the first metal is at least one metal selected from the group consisting of gold (Au), silver (Ag), copper (Cu), palladium (Pd), and aluminium (Al), and the second metal is at least one metal selected from the group consisting of titanium (Ti), chromium (Cr), silver (Ag), copper (Cu), aluminium (Al), nickel (Ni), manganese (Mn), iron (Fe), zinc (Zn), gallium (Ga), and tantalum (Ta).

2. The optical device according to claim 1, wherein the nanostructure body contains at least one elemental metal selected from the group consisting of gold (Au), silver (Ag), copper (Cu), aluminium (Al), and palladium (Pd).

3. The optical device according to claim 1, wherein the nanostructure body contains at least one metal nitride selected from the group consisting of titanium nitride (TiN), zirconium nitride (ZrN), tantalum nitride (TaN), and hafnium nitride (HfN).

4. The optical device according to claim 1, wherein the nanostructure body contains at least one conductive oxide selected from the group consisting of tin-doped indium oxide (ITO), aluminium-doped zinc oxide (AZO), and gallium-doped zinc oxide (GZO).

5. The optical device according to claim 1, wherein the n-type semiconductor is an inorganic semiconductor.

6. The optical device according to claim 1, wherein the nanostructure body has a comb-shaped structure.

7. The optical device according to claim 1, wherein
the nanostructure body includes at least one nanoparticle, and
a particle diameter of the at least one nanoparticle is greater than or equal to 1 nm and less than or equal to 200 nm.

8. The optical device according to claim 1, further comprising a light source that emits light having an energy which is lower than or equal to a band gap energy of the n-type semiconductor and which corresponds to a plasmon resonance wavelength of the nanostructure body.

9. The optical device according to claim 1, wherein
the n-type semiconductor comprises at least one selected from the group consisting of silicon semiconductors, germanium semiconductors, and gallium arsenide semiconductors, and
a surface plasmon resonance wavelength of the nanostructure body is greater than or equal to 900 nm.

10. The optical device according to claim 1, wherein
the n-type semiconductor comprises at least one selected from the group consisting of titanium oxide (TiO$_2$) semiconductors, gallium nitride (GaN) semiconductors, and strontium titanate (SrTiO$_3$) semiconductors, and
a surface plasmon resonance wavelength of the nanostructure body is greater than or equal to 400 nm.

11. A photoelectric converter comprising:
the optical device according to claim 1;
an electrode; and
a conductor that electrically connects the electrode and the nanostructure body,
wherein the n-type semiconductor has a first surface that is in contact with the alloy layer and a second surface that is opposite to the first surface, and
the electrode is in contact with the second surface of the n-type semiconductor.

12. The photoelectric converter according to claim 11, further comprising a transparent conductive film that covers the nanostructure body,
wherein the transparent conductive film is not in contact with the n-type semiconductor, and
the conductor electrically connects the electrode and the transparent conductive film.

13. A fuel generator comprising:
the optical device according to claim 1;
a first electrode that is in contact with the n-type semiconductor in the optical device;
an oxidation reaction tank that contains a first electrolytic solution and the optical device;
a reduction reaction tank that contains a second electrolytic solution and a second electrode;
a proton-permeable membrane that is located at a boundary between the oxidation reaction tank and the reduction reaction tank; and
a conductor that connects the first electrode and the second electrode,
wherein the optical device is in contact with the first electrolytic solution, and
the second electrode is in contact with the second electrolytic solution.

14. The fuel generator according to claim 13, wherein when light with an energy corresponding to a surface plasmon resonance wavelength of the nanostructure body is incident on the nanostructure body in the optical device, hydrogen is generated on the second electrode.

15. The fuel generator according to claim 13, wherein the first electrolytic solution is an aqueous solution that contains at least one selected from the group consisting of potassium hydrogen carbonate ($KHCO_3$), sodium hydrogen carbonate ($NaHCO_3$), potassium hydroxide (KOH), and sodium hydroxide (NaOH).

16. The fuel generator according to claim 13, wherein the second electrolytic solution is an aqueous solution that contains at least one selected from the group consisting of potassium hydrogen carbonate ($KHCO_3$), sodium hydrogen carbonate ($NaHCO_3$), potassium chloride (KCl), and sodium chloride (NaCl).

17. The optical device according to claim 1, wherein
the n-type semiconductor has a plurality of recesses and protrusions, and
a center-to-center distance between two neighboring recesses or protrusions is greater than or equal to 1 nm and less than 1 μm.

18. The optical device according to claim 1, wherein
the n-type semiconductor has a plurality of recesses and protrusions, and
the alloy layer is conformally formed over the plurality of recesses and protrusions.

* * * * *